United States Patent
Andreaco et al.

(10) Patent No.: US 9,744,578 B2
(45) Date of Patent: Aug. 29, 2017

(54) CRYSTAL GROWTH CRUCIBLE RE-SHAPER

(71) Applicant: Siemens Medical Solutions USA, Inc., Malvern, PA (US)

(72) Inventors: Mark S. Andreaco, Knoxville, TN (US); Troy Marlar, Knoxville, TN (US); Brant Quinton, Knoxville, TN (US); James L. Corbeil, Knoxville, TN (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 35 days.

(21) Appl. No.: 15/088,335

(22) Filed: Apr. 1, 2016

(65) Prior Publication Data

US 2016/0303631 A1    Oct. 20, 2016

Related U.S. Application Data

(60) Provisional application No. 62/149,710, filed on Apr. 20, 2015.

(51) Int. Cl.
| | |
|---|---|
| *C30B 15/10* | (2006.01) |
| *B21D 3/02* | (2006.01) |
| *B21D 3/14* | (2006.01) |
| *C30B 35/00* | (2006.01) |
| *B21D 51/18* | (2006.01) |
| *B21D 35/00* | (2006.01) |

(52) U.S. Cl.
CPC ............... *B21D 3/02* (2013.01); *B21D 3/14* (2013.01); *C30B 35/002* (2013.01); *B21D 35/005* (2013.01); *B21D 51/18* (2013.01)

(58) Field of Classification Search
CPC ......... C30B 15/10; C30B 13/14; C30B 11/00; C30B 29/10
See application file for complete search history.

(56) References Cited

U.S. PATENT DOCUMENTS

| | | | | |
|---|---|---|---|---|
| 4,802,180 A | * | 1/1989 | Brandle, Jr. ............ | C30B 15/00 252/301.17 |
| 5,164,041 A | * | 11/1992 | Berkstresser ........... | C30B 15/00 117/19 |
| 5,204,164 A | * | 4/1993 | Sangyoji ................. | B41M 3/12 428/200 |
| 2004/0090210 A1 | * | 5/2004 | Becker .................... | F21L 13/06 322/1 |
| 2012/0031325 A1 | | 2/2012 | Andreaco et al. | |
| 2012/0200920 A1 | * | 8/2012 | Sanada ................... | C30B 15/00 359/484.03 |
| 2013/0087094 A1 | | 4/2013 | Quinton et al. | |
| 2013/0135724 A1 | * | 5/2013 | Funaki .................... | C30B 15/00 359/484.03 |

* cited by examiner

Primary Examiner — Robert M Kunemund

(57) ABSTRACT

Roll forming is used for re-shaping an iridium crucible. The crucible is placed on a platen. The platen rotates the crucible while heat is applied by a plurality of torches. A plurality of rollers press on the rotating, heated crucible to re-shape. The roll forming allows for a greater number of repetitions of the re-shaping, increasing the number of uses per expensive re-fabrication of the crucible. The roll forming may provide more exact re-shaping.

21 Claims, 2 Drawing Sheets

CRYSTAL GROWTH CRUCIBLE RE-SHAPER

RELATED APPLICATIONS

The present patent document claims the benefit of the filing dates under 35 U.S.C. §119(e) of Provisional U.S. Patent Application Ser. Nos. 62/149,710, filed Apr. 20, 2015, which is hereby incorporated by reference.

BACKGROUND

The present embodiments relate to re-shaping a crucible used in crystal growth.

For positron emission tomography (PET), scintillation crystals are used for detecting positron emissions. Cerium-doped lutetium oxyorthosilicate (LSO:Ce) is a commonly used crystal in PET. Iridium crucibles are used in production for high temperature oxide crystals, such as LSO:Ce, due to several properties of the metal. Iridium will withstand the high temperature (e.g., 2,150° C.) of crystal growth and couples well with radio frequency (RF) power supplies, which are capable of heating the crucibles to such high temperatures.

Cool down from high temperature oxide crystal growth deforms the iridium crucible. Where the crystal material is left to cool inside of the crucible during cool down, a difference in the coefficient of thermal expansion of the iridium and remaining crystal material in the crucible causes the side walls at the bottom of the crucible to swell. This bulge not only stretches the crucible but also thins the metal and ultimately shortens the life of the crucible. If used for more crystal growth, the deformed shape causes a stagnation of melt flow during crystal growth inhibiting successful sequential growth runs. The crucible will eventually swell so large that the crucible can no longer be placed into the ceramics inside the growth chamber. At this point, the crucible is traditionally sent back to the manufacturer to be melted back into sheet and re-fabricated into a new crucible.

Iridium is very difficult and expensive to work, needing diamond tooling, electro discharge machining, and other expensive forming methods to re-fabricate. To prolong use of a given crucible, the crucible is re-shaped a number of times before ultimately needing to re-fabricate due to metal creep and/or grain boundary growth deterioration. To re-shape, the crucible is heated with a tig torch. Once heated, a technician uses a hammer to attempt to remove the warping. This "blacksmith" process may allow for only a few iterations of re-shaping before the crucible needs to be re-fabricated. The "blacksmith" process is also inexact.

BRIEF SUMMARY

By way of introduction, the preferred embodiments described below include methods and systems for re-shaping a crucible. Roll forming is used. The crucible is placed on a platen. The platen rotates the crucible while heat is applied by a plurality of torches. A plurality of rollers press on the rotating, heated crucible to re-shape. The roll forming allows for a greater number of repetitions of the re-shaping, increasing the number of uses per expensive re-fabrication of the crucible. The roll forming may provide more exact re-shaping.

In a first aspect, a system is provided for re-shaping a used iridium crucible. A platen is configured to receive the used iridium crucible. A plurality of torches is positioned to heat the used iridium crucible positioned on the platen. A plurality of rollers is positioned adjacent to the platen to contact the heated, used iridium crucible positioned on the platen. A motor is for rotating the platen while the heated iridium crucible is in the contact with the rollers.

In a second aspect, a method is provided for re-shaping a crucible warped due to use growing crystals. The crucible warped due to use growing crystals is placed on roll former. Heat is applied to the crucible. The heated crucible is re-shaped by the roll former so that the crucible has less warping.

In a third aspect, a method is provide for use of a crucible in crystal growing. A plurality of crystals is grown in sequence from crystal material in an iridium container. The cooling of the crystal material in the iridium container as part of the growing warps the iridium container. Residual crystal material is removed from the iridium container after the growing of the sequence. An automation tool roll forms the iridium container. The roll forming removes at least some of the warping. The growing, removing, and roll forming are repeated a plurality of times with the iridium container.

The present invention is defined by the following claims, and nothing in this section should be taken as a limitation on those claims. Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE DRAWINGS AND PRESENTLY PREFERRED EMBODIMENTS

To prolong the use of a crucible used for crystal growth, a picker re-shaper addresses the swelling in the bottom of the crucible. The re-shaper reforms the crucible back into a right circular cylinder or other tapered cylinder. The re-shaper reforms by heating the crucible with torches until the crucible metal reaches a ductile temperature (e.g., ductile region of Iridium). Once this temperature is reached, rollers form the crucible back into a right circular cylinder by squeezing the crucible between the rollers as the crucible rotates a little at a time. Once the rollers have reached a designated position (i.e., moved to a certain location), the crucible has been roll formed back into an as new condition and is ready for further sequential growth runs.

For growing crystals used in PET, the automatic re-shaper tool may extend the life of the crucible from about 13 growth runs using the "blacksmith" process to about 50 growth runs. At a cost of over ten thousand dollars for re-fabricating the crucible, this difference in life of the iridium crucible may provide substantial savings. The re-shaper may provide a more exact or better re-shaping than the "blacksmith" process and provide better grain refinement in the metal.

Figure 1:
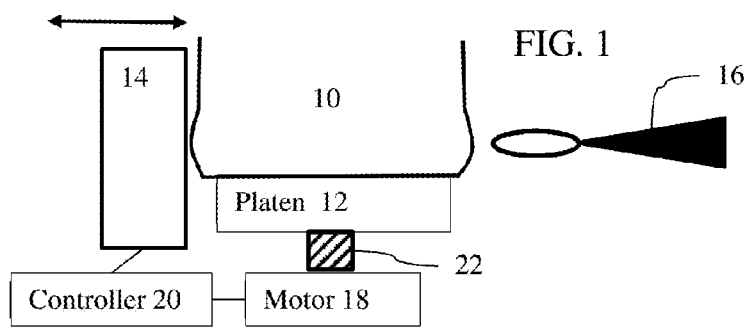
FIG. 1 illustrates one embodiment of an automation tool for re-shaping a crucible.
Figure 2:
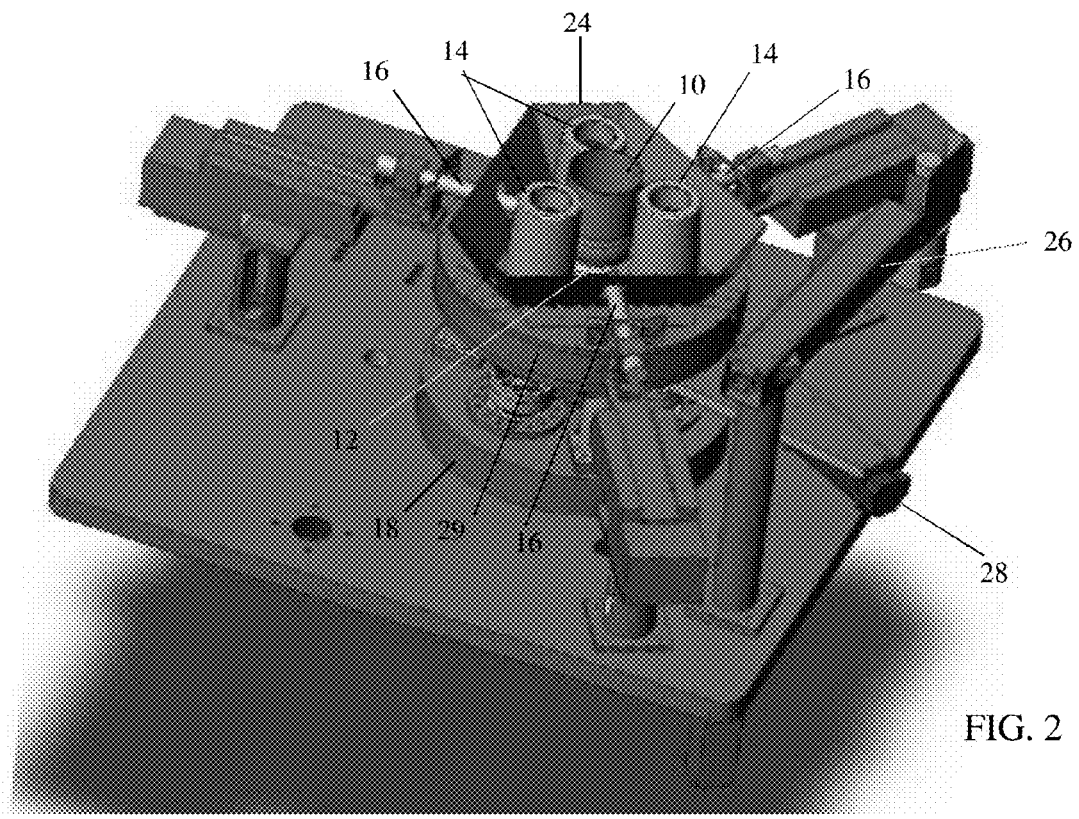
FIG. 2 illustrates another embodiment of an automation tool for re-shaping a crucible.

FIG. 1 is a cross-section view of one embodiment of a system for re-shaping a used iridium or other crucible 10. FIG. 2 is a perspective view of another embodiment of the system for re-shaping a deformed crucible. Either of the systems is used in the method of FIGS. 3 and/or 4 or other methods.

In the embodiment of FIG. 1, the re-shaping tool includes a platen 12, a roller 14, a torch 16, a motor 18, a controller 20, and a spring 22. Additional, different, or fewer components may be provided. For example, two or more rollers 14 and/or torches 16 are used. As another example, the spring 22 is not provided. In yet another example, the controller 20 is not provided, but instead the re-shaper tool is manually operated. In another example, a motor or servo for the roller 14 is provided.

FIG. 2 provides an example of the re-shaper of FIG. 1, but with additional components. For example, a heat shield 24, a picker or lift 26 for handling the crucible 10, a servo 28, and gears 29. The motor 18 may be underneath or not provided where the rollers 14 drive the rotation of the crucible 10. The motor or motors for driving rollers, if provided, are also underneath are provided. In further examples, a housing, fume hood, and sensors (e.g., force feedback sensor on the servo 28 from the rollers 14) are provided.

The platen 12 is a metal plate for supporting the crucible 10. The platen 12 is sized and shaped to receive the used iridium crucible 10. The platen 12 is flat on a top surface and round with a diameter less than a base of the crucible 10 (i.e., less than the desired outer diameter of the crucible are reformed to a right circular cylinder). Other shapes or designs than a plate may be used, such as three prongs, square, or screen. The platen 12 is undersized relative to the crucible 10, preventing draw down of crucible material into a concave form and to prevent collision of the platen 12 with the rollers 14.

The crucible 10 is held on the platen 12 by gravity. Depending on the type of material, a magnet, a clamp, or bolt may be used.

The platen 12 connects to the spring 22 and/or motor 18. The spring 22 is a metal spring. More than one spring 22 may be used, such as three or more springs 22. The spring 22 is centered under the platen 12, but may be at other positions where multiple springs 22 are used.

The spring 22 supports the platen 12. Downward pressure from the crucible 10 via rollers 14 compresses the spring 22. Any size spring 22 providing any desired resistance to compression and/or stretching may be used.

The spring 22 rotates with the platen 12 when driven by the motor 18. Alternatively, the platen 12 includes multiple plates and a bearing. The spring 22 supports a part of the platen 12 that does not rotate while the motor 18 drives the other part of the platen 12 to rotate the crucible 10. The spring 22 restores the platen 12 with the crucible to an initial position each time the rollers 14 are released during incremental forming. The platen 12 is undersized such that the rollers 14 contact the crucible 10 even at the final diameter. If the platen 12 is not restored to the starting position, the crucible 10 is drawn between the platen 12 and the rollers 14, forming a concave bottom (from bottom outside perspective) and possibly ruining the crucible 10.

The motor 18 is an induction motor, but other motors (e.g., servo) may be used. The motor 18 causes the platen 12 to rotate the crucible 10 so that the side of the crucible 10 runs along or over the roller 14. The drive shaft of the motor 18 connects directly to the platen 12. Alternatively, the drive shaft connects to a transmission or other gearing, which connects to the platen 12 or rollers 14 for rotating the crucible 10. Other interconnections may be used, such as a chain drive.

The motor 18 is spaced from the platen 12 to avoid overheating due to operation of the torches 16 and the heat of the crucible 10. Radiator fins, water cooling, or other active or passive cooling may be provided for the motor 18 and/or other components of the re-shaper.

The motor 18 rotates the platen 12 while the heated iridium or other crucible 10 is in contact with the rollers 14. The motor 18 may not rotate the platen 12 until after placement of the crucible 10 on the platen 12 or may rotate the platen 12 whether or not the crucible 10 is placed on the platen 12. For heating and/or roll forming, the motor 18 moves the platen 12. Any speed of rotation may be used. The speed may be constant or vary over time, roller pressure, and/or temperature. In alternative embodiments, the roller 14 is a driven roller, causing the roller 14 and crucible 10 to rotate without the motor 18 or with the motor 18 connected to the rollers 14.

The crucible rotation is independently derived, though decoupled, from frictional forces between the roller 14 and the crucible 10 and the crucible 10 and the platen 12. This decoupling of the center platen rotation allows a wide range of crucible diameters to be shaped.

The torches 16 are heating torches, such as oxygen acetylene torches. Cutting torches or other torches may be used. In alternative embodiments, radio frequency or other heating devices than the torch 16 are used for heating the crucible 10 while placed on the platen 12. The torch 16 heats the crucible 10 to a ductile temperature.

The torch 16 is positioned to direct flame or heat at the deformed region of the crucible 10. The flame or heat may be directed at other parts of the crucible 10 as well or instead. The torch 16 is directed at the exterior of the crucible 10, but may be directed at the interior.

In one embodiment, the torch 16 is connected to a motor for moving the torch 16 towards and away from the crucible 10, such as to modulate the heating. A rack and pinion, chain, slide, cam, or screw drive are used to move the torch 16 along a rail or track. Alternatively, the torch 16 has a fixed or constant position. A valve may be used to increase or decrease the flame from the torch 16.

Any number of torches 16 may be provided. Two or more torches 16 may be used in one example. In the embodiment of FIG. 2, three torches 16 are directed at the crucible 10. The torches 16 are equidistantly spaced about the crucible 10, such as at every 120° of rotation about the crucible 10 and platen 12. Non-equal spacing may be used. By providing rotation of the crucible 10 by the platen 12 and/or multiple torches 16 spaced apart, more uniform heating is applied to the crucible 10.

The roller 14 is H13 steel with or without coating (e.g., nitride coating). Other hot work materials may be used. The roller 14 includes bearings for allowing the roller 14 to rotate due to contact or friction with the crucible 10. The roller 14 is passive or fee spinning. Alternatively, the roller 14 is driven or rotates based on force from a motor. Water cooling or other cooling may reduce the temperature of the roller 14, such as water cooling the bearings of the roller 14. A bottom of the roller 14 may be water cooled to prevent heat migration toward any transmission, other gearing, and/or motor.

The roller 14 is positioned adjacent to the platen 12. The roller 14 is positioned to contact the heated, used iridium crucible 10 when positioned on the platen 12. The contact by a contact surface of the roller 14 is initially made at a most bowed or warped part of the crucible 10. As the warping is reformed, the contact surface of the roller 14 with the crucible 10 increases.

The roller 14 is a right circular cylinder. The roller 14 is canted inward where the top of the roller 14 would make contact with a right circular cylinder as the crucible first. The cant or lean is small, such as about 1 mm. About is used for tolerance. The cant or non-parallel angle of the roller to the crucible 10 or other rollers 14 acts to press downward on the crucible 10 and platen 12, holding the crucible 10 in place and compressing the spring 22. The angle applies pressure mostly horizontally, but also vertically. The angle is small enough that the roller 14 contacts the warped or bowed region of the crucible 10 first as the roller 14 is moved against the crucible 10. In other embodiments, the roller 14 is a right circular cylinder with no cant (i.e., is vertical or parallel to the crucible 10 and/or other rollers 14 if the crucible 10 where a right circular cylinder). In other embodiments, the roller 14 has an hour-glass shape or other curvature of the contact surface.

Any number of rollers 14 may be provided. Two or more rollers 14 may be used in one example. In the embodiment of FIG. 2, three rollers 14 surround the crucible 10 in order to balance the forces applied to the crucible 10. The rollers 14 are equidistantly spaced about the crucible 10, such as at every 120° of rotation about the crucible 10 and platen 12. Non-equal spacing may be used. The rollers 14 are interspersed with the torches 16 in a horizontal plane around the platen 12. The uniform distribution of the rollers 12 acts to more evenly roll form and holds the crucible 10 on the platen 12 during roll forming.

By providing rotation of the crucible 10 by the platen 12 while applying pressure by the rollers 14, the heated crucible 10 is roll formed. The rollers 14 act to remove the warp or bulge. The pressure from the rollers 14 counters the deformation previously caused by the cooling of the crystal material.

The roller 14 includes a mount or axle that may move away and towards the platen 12. When the crucible 10 is to be positioned on the platen 12, the roller 14 is moved away from the platen 12. After or while heat is applied by the torch 16, the roller 14 is moved towards to begin contact and then press against the crucible 10 without interference by the platen 12. Any range of motion, such as inches, centimeters, or millimeter ranges, may be used. The motion is linear, such as towards and away from the crucible 10 (see the arrows of FIG. 1). Alternatively, the motion is along a curved path with a component towards and away from the crucible 10. All, less than all, one, or none of the rollers 14 move.

A servo 28 connects to one or more of the rollers 14 through gears 29. One servo 28 connects to all of the rollers 14 through gearing or other transmission. Alternatively, separate servos 28 are provided for each roller 14 and/or the servo 28 directly connects to the roller 14 without gearing. In one embodiment, the servo 28 connects to the mounts or axles of the rollers 14 through rack and pinion gears, but other gearing, slides, cam or chain drive may be used. The servo 28 moves, causing the rollers 14 to translate towards or away from the crucible 10 and platen 12. The movement is equally inward toward the center of the crucible rotation. In one embodiment, a linear rack and pinion with a cam is driven by a linear actuator to tilt the rollers 14 simultaneously and move the rollers 14 equally radially inward towards the center of the rotation of the crucible 10. Other types of motors than a servo 28 may be used.

The controller 20 controls the motor 18 of the platen 12, any valve or drive of the torch 16, and/or the servo 28 for the rollers 14. Using timing, sensed placement of the crucible 10, or in response to activation, the controller 20 causes the platen 12 to spin (i.e., after placing the crucible on the platen 12, the re-shaper is activated). The controller 20 causes torches 16 to ignite, move, and/or change intensity. The controller 20 causes the servo 28 to move the rollers 14 a particular distance over a particular time. Distance of movement is used to control the re-shaping of the crucible. The rollers 14 are moved over a predetermined or input range. Any delays, incremental movement, speed of movement, or other controllable characteristic of the motor 18, torch 16, and/or servo 28 may be controlled by the controller 20.

In other embodiments, the controller 20 operates in response to one or more sensors. For example, a temperature sensor is used to determine the temperature of the crucible 10 to modulate operation of the torch 16 and/or to control the timing of the roll forming (i.e., moving the rollers 14 into contact or applying more pressure) to occur when the crucible 10 is deformable. As another example, a force feedback sensor on the servo 28 is used to control when to activate the servo 28 to apply more pressure on the crucible 10 by the rollers 14. The controller 20 controls the servo 28 to move the rollers 14 over a certain distance or to a certain location, but times the incremental movements based on the force feedback sensor.

The heat shield 24 is a metal box or tray. One or more holes or slots are provided for movement of the rollers 14, spinning of the platen 12, and/or the torches 16 or flames from the torches. The heat shield 24 is passively or actively cooled, such as including channels for coolant to circulate. The heat shield 24 acts to reflect heat back to the crucible and/or reduce the heat extending to other components beyond the shield 24. In alternative embodiments, no, additional, or different heat shielding is used.

The re-shaper is encased in a housing (not shown) for operation. The picker 27 is a robotic arm for placing and removing the crucible 10. A hole or door is provided in the housing for passing the crucible 10 to the picker 27 or receiving the crucible 10 from the picker 27. The housing protects operators from injury and/or provides further heat shielding. A window or hole may be provided for visual determination of completion of the reforming and/or to verify desired operation.

A fume head or exhaust port or fan may be provided. The fume may connect with the housing or be separate and positioned above the housing.

Figure 3:
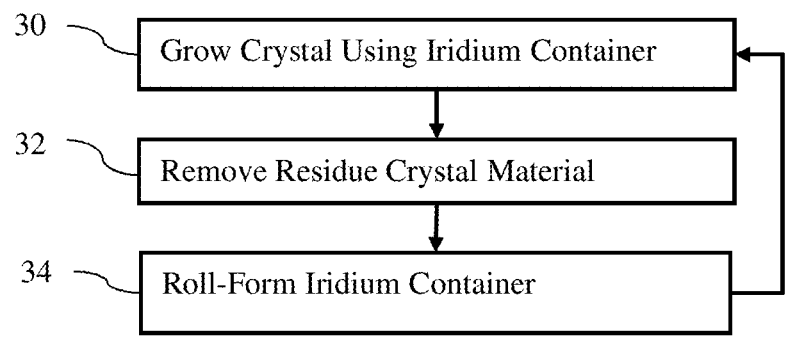
FIG. 3 is a flow chart of one embodiment of a method for using a crucible in crystal growing.

FIG. 3 shows a method for use of a crucible in crystal growing. An automatic tool that reforms the deformed crucible is used in a repetitive process with crystal growing. The method includes roll forming to increase the life span, reduce cost of re-fabrication, and increase usefulness of deformed crucibles.

The method is implemented using a crucible, crystal-growing material, and a roll former, such as the re-shaper of FIG. 1, FIG. 2, or other re-shaper.

Additional, different, or fewer acts may be performed. For example, the repetition from act 34 to act 30 is not performed. The acts are performed in the order shown or a different order. For example, act 30 is repeated five or other number of times before performing acts 32 and/or 34. As another example, any number of repetitions of acts 30-34, in which act 30 is performed after act 34, is performed.

In act 30, any number of crystals is grown in sequence from crystal material in an iridium or other container. The crystal material, such as LSO:Ce, is in the container. The Czochralski or other process of crystal growing is used to grow single crystals for use in PET detectors or other use. The container is heated to turn the LSO:Ce into a liquid, such as using RF energy to melt. A seed crystal is introduced and the crystal formed on the seed is pulled, resulting in the crystal and leaving a residue of crystal material in the container.

To grow multiple crystals, the same crystal material is used in sequence to create the crystals. The crystal material may be cooled, more material added, and then re-heated for each crystal. Crystal material may be added without cooling. The container and residue crystal material may be allowed to cool after the sequence of crystals is formed or between formation of each crystal. The cooling of the residual crystal material in the container deforms (e.g., swells) the container. The container is warped due to the differences in the thermal expansion coefficient of the iridium or other container material and the crystal material. Since the residual crystal material is in the bottom of the container, the deformation tends to occur as a bulging of the sides at the bottom of the container.

For proper heating or other growing processes, the bulge or warping of the container is undesired. There may be some tolerance, allowing repetition of the growing without re-shaping. At a certain point, the warp is substantial enough that the container is to be re-shaped. Substantial enough may be different for different purposes and may be measured by amount of warping, assumed by number of cooling cycles, or other criterion.

In act 32, the residual crystal material is removed from the container after the growing of the sequence. Once cooled, the residual crystal material is a solid in the bottom of the container. Due to the bulging or warping of the container, the solid block of residual material may not be removed easily. The residual material may be chiseled out or otherwise broken and removed.

In act 34, the container is roll formed with an automated tool. The re-shaper or other roll former removes at least some of the warping. The container is reformed to be flatter or more of a right circular cylinder.

The container is heated. For iridium, the container is heated to a ductile temperature, but more or less heating may be used. Torches apply flame or generate heat, causing the container to be more ductile. The radial position of the torches about the crucible is adjustable through an electro/mechanical system, allowing for greater temperature refinement. Once or as being heated, one or more rollers press on the container as the container is rotated. Alternatively, the rollers roll around the stationary container or are driven to then rotate the container. With multiple rollers, the pressing occurs from multiple directions simultaneously. The pressing by the rollers causes the material of the container to redistribute, reducing the warpage. The rollers may move towards the container over time, gradually roll forming to flatten or reform over a greater surface over time. By moving the rollers a predetermined, sensor controlled, or user set distance while moved relative to the container, the bulge in the container is reduced.

Where the rollers are tilted downwards relative to the crucible or shaped with curvature, the pressure of the rollers on the crucible includes a downward component. With a spring or other elastic support of the platen and/or crucible, the crucible moves downward. The spring movement modulates the pressure applied by the rollers and/or holds the crucible in place between the rollers for application of the pressure.

A controller controls the speed of the rotation of the crucible relative to the rollers or speed of the rollers relative to the crucible. Any speed may be used. The controller also controls the pressure and/or distance of travel of the rollers. The magnitude of the inward motion against or towards the container is controlled as well as the timing. Any pressure curve may be used for the pressure applied by the rollers, such as a linear or non-linear curve until the rollers are at a given distance from the platen. Force sensing may alternatively or additionally be used, such as moving the rollers until a given force or force threshold is reached. The controller may control the torch position, flame intensity, and/or timing.

The feedback from act 34 to act 30 represents repetition of the growing, removing and roll forming of acts 30-34. Due to the roll forming with the automatic tool, more repetitions may occur as compared to using the "blacksmith" process to re-shape the container. For example, 50 or more runs for crystal growing are performed with the roll forming being repeated every 5 or so runs as compared to 13 runs for growing with the blacksmith process being repeated 2 times.

Figure 4:
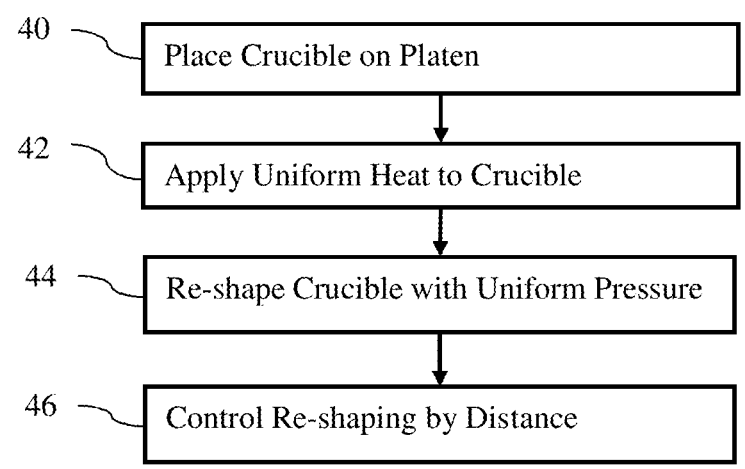
FIG. 4 is a flow chart diagram of one embodiment of a method for re-shaping a crucible.

FIG. 4 shows one embodiment of a method for re-shaping a crucible warped due to use growing crystals. FIG. 4 represents an approach for implementing act 34 of FIG. 3. The re-shaper of FIG. 1 or 2 or another roll former is used.

Additional, different, or fewer acts may be provided. For example, act 46 is not provided where the control is performed manually by visual inspection of the crucible or using other information than distance.

The acts are performed in the order shown or a different order. For example, act 46 is performed simultaneously with or as part of acts 42 and/or 44.

In act 40, the crucible is placed on a roll former. The crucible is warped due to use growing crystals. The warped crucible is placed by a person or a robotic arm (e.g., a picker) on a plate or other support for the crucible during roll forming.

In act 42, heat is applied to the crucible while in the roll former. The crucible is heated from the outside and/or inside. For example, three or more torches direct flame at or onto the crucible while positioned on the roll former. To distribute the heat, the torches and/or the crucible are moved relative to each other. For example, the plate supporting the crucible rotates at any speed. The torches are stationary or move towards the crucible, so heat different parts of the crucible as the crucible rotates. By having multiple torches, more uniform heating is applied.

The heating occurs continuously, including while the roll forming or pressure is applied to the crucible. In alternative embodiments, the heating occurs intermittently, such as heating to and maintaining the crucible at a given temperature within a tolerance. The flame intensity or proximity of the torches to the crucible may be modulated to control the temperature.

In act 44, the roll former re-shapes the heated crucible. The re-shaping removes some of the warping of the crucible. A plurality of rollers is pressed against the crucible. The rollers apply uniform pressure from equidistant locations around the crucible. The pressure may vary over time or be kept constant within a range. As the crucible is re-shaped, the rollers are moved to continue to apply pressure for further re-shaping.

By driving the rollers and/or the crucible to rotate, the pressure by the rollers on the crucible is applied more uniformly over time. The pressure acts to re-shape the heated crucible. The crucible is reformed into a right circular cylinder or more of a right circular cylinder than prior to roll forming.

In embodiments where the rollers are tilted or canted so that the contact surfaces of the rollers are not vertical and/or parallel, the pressure against the crucible has a downward component or a component of pressure compressing the spring. This pressure acts to hold the crucible in place on the platen. The spring may act to modulate the pressure applied by the rollers.

In act 46, the controller controls the automatic tool. The re-shaper is controlled, such as controlling the rotation of the crucible, operation of the picker to place the crucible, intensity of the torch, position of the torch, and movement of the rollers. The controller controls the rollers based on distance relative to the crucible. The distance of the rollers is changed until the rollers are at a given position for re-shaping. The distance may be changed constantly, in steps, or combinations thereof. In one embodiment, the rollers are moved based on distance and force feedback. The force feedback indicates when more pressure can be applied until the rollers have moved to a particular position or other indicator of sufficient distance.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

We claim:

1. A system for re-shaping a used iridium crucible, the system comprising:
    a platen configured to receive the used iridium crucible;
    a plurality of torches positioned to heat the used iridium crucible positioned on the platen;
    a plurality of rollers positioned adjacent to the platen so as to contact the heated, used iridium crucible positioned on the platen;
    a motor for rotating the platen while the heated iridium crucible is in the contact with the rollers;
    a spring for repositioning the iridium crucible during incremental roll forming by the rollers;
    a transmission for driving the rollers towards a center of rotation of the iridium crucible; and
    a controller configured to time movements of the rollers.

2. The system of claim 1 wherein the rollers are tilted toward the iridium crucible such that pressure is applied at a largest diameter of the iridium crucible, loading the spring.

3. The system of claim 2 wherein the controller is configured to cause incremental withdrawal of the rollers from the iridium crucible, allowing the spring to return the platen with the iridium crucible to a starting position.

4. The system of claim 1 wherein the plurality of torches comprises three or more heating torches spaced equidistant about the platen, the three or more heating torches being radially adjustable.

5. The system of claim 1 wherein the plurality of rollers comprises three or more rollers spaced equidistant about a center of rotation of the platen.

6. The system of claim 1 wherein the motor comprises an induction motor.

7. The system of claim 1 further comprising a servo connected to the rollers through a transmission such that the servo is configured to tilt the rollers and move the rollers towards a center of rotation of the iridium crucible.

8. The system of claim 7 further comprising a controller configured to control the servo based on distance of the movement of the rollers relative to the platen.

9. The system of claim 1 wherein the rollers comprise water cooled rollers.

10. A method for re-shaping a crucible warped due to use growing crystals, the method comprising:
    placing the crucible warped due to use growing crystals on roll former;
    applying heat to the crucible; and
    re-shaping the heated crucible by the roll former so that the crucible has less warping.

11. The method of claim 10 wherein placing comprises placing the crucible on a plate supported by a spring, and wherein applying the heat comprises applying the heat while the plate rotates.

12. The method of claim 11 wherein re-shaping comprises pressing rollers tilted relative to the crucible against the crucible, the pressing compressing the spring.

13. The method of claim 10 wherein applying the heat comprises directing a plurality of torches at the crucible while in the roll former.

14. The method of claim 10 wherein re-shaping comprises roll forming with a plurality of rollers pressed against the crucible, the rollers applying balanced pressure from equidistant locations around the crucible.

15. The method of claim 10 further comprising controlling the re-shaping based on distance of rollers relative to the crucible.

16. The method of claim 10 wherein re-shaping comprises forming the crucible into a right circular cylinder.

17. A method for use of a crucible in crystal growing, the method comprising:
    growing a plurality of crystals in sequence from crystal material in an iridium container, wherein cooling the crystal material in the iridium container as part of the growing warps the iridium container;
    removing residual crystal material from the iridium container after the growing of the sequence;
    roll forming the iridium container with an automated tool, the roll forming removing at least some of the warping; and
    repeating the growing, removing, and roll forming a plurality of times with the iridium container.

18. The method of claim 17 wherein roll forming comprises balanced heating and pressing the iridium container from multiple directions simultaneously.

19. The method of claim 17 wherein roll forming comprises supporting the iridium container with a spring and pressing the iridium container with rollers tilted relative to the crucible, the tilt transmitting the pressing onto the spring.

20. The method of claim 17 wherein roll forming with the automated tool comprises roll forming with rollers moved a predetermined distance while the iridium container is rotated.

21. The method of claim 17 further comprising returning by a spring the crucible to a start position due to incremental release of rollers.

* * * * *